US010939546B2

(12) United States Patent
Fowler et al.

(10) Patent No.: US 10,939,546 B2
(45) Date of Patent: Mar. 2, 2021

(54) INTERCONNECT DEVICE (71) Applicant: Eagle Technology, LLC, Melbourne, FL (US)

(72) Inventors: Clarke O. Fowler, Merritt Island, FL (US); Voi Nguyen, Oviedo, FL (US)

(73) Assignee: EAGLE TECHNOLOGY, LLC, Melbourne, FL (US)

(*) Notice: Subject to any disclaimer, the term of this patent is extended or adjusted under 35 U.S.C. 154(b) by 0 days.

(21) Appl. No.: 16/259,889

(22) Filed: Jan. 28, 2019

(65) Prior Publication Data
US 2020/0245455 A1 Jul. 30, 2020

(51) Int. Cl.
*H05K 1/02* (2006.01)
*H01Q 1/24* (2006.01)
*H05K 1/14* (2006.01)
*H05K 3/32* (2006.01)
*H05K 1/11* (2006.01)
*H01R 13/6474* (2011.01)

(52) U.S. Cl.
CPC ............ *H05K 1/0284* (2013.01); *H01Q 1/243* (2013.01); *H05K 1/144* (2013.01); *H05K 3/32* (2013.01); *H01R 13/6474* (2013.01); *H05K 1/11* (2013.01); *H05K 1/117* (2013.01); *H05K 1/119* (2013.01)

(58) Field of Classification Search
CPC .......... H05K 1/11; H05K 1/111; H05K 1/117; H05K 1/119; H05K 1/0284; H05K 3/32; H01R 13/6474; H01R 24/42; H01R 24/44
See application file for complete search history.

(56) References Cited

U.S. PATENT DOCUMENTS

| | | | | |
|---|---|---|---|---|
| 5,522,727 A * | 6/1996 | Saito | ................... | H01R 13/658 439/65 |
| 5,674,093 A * | 10/1997 | Vaden | ................ | H01R 13/6461 439/676 |
| 6,062,913 A * | 5/2000 | Puerner | ................ | H01R 13/504 439/687 |
| 6,109,935 A * | 8/2000 | Yang | ................... | H01R 12/725 439/80 |
| 6,135,790 A * | 10/2000 | Huang | ................... | H01R 13/41 439/607.01 |
| 6,402,389 B1 * | 6/2002 | Steijer | ................. | G02B 6/3829 385/114 |
| 6,491,545 B1 * | 12/2002 | Spiegel | ................ | H01R 13/514 439/579 |
| 6,934,450 B2 * | 8/2005 | Hiramatsu | ........... | G02B 6/4292 385/126 |
| 7,033,084 B2 * | 4/2006 | Lappohn | .............. | G02B 6/3885 385/73 |
| 7,527,435 B2 * | 5/2009 | Dean, Jr. | .............. | G02B 6/3829 385/78 |

(Continued)

*Primary Examiner* — Steven T Sawyer
*Assistant Examiner* — Paresh H Paghadal
(74) *Attorney, Agent, or Firm* — Fox Rothschild LLP; Robert J. Sacco; Carol E. Thorstad-Forsyth (57) ABSTRACT

Systems and methods for making an interconnect device for electronic circuits. The methods comprise: fabricating a housing as a single 3D printed part having a plurality of apertures with bend angles less than ninety degrees; inserting wires into the plurality of apertures of the housing; and establishing electrical connections respectively between (A) the wires and a plurality of first socket adaptors and (B) the wires and a plurality of second socket adaptors.

11 Claims, 9 Drawing Sheets

(56) References Cited

U.S. PATENT DOCUMENTS

| | | | | |
|---|---|---|---|---|
| 8,033,841 B2* | 10/2011 | He | ............... | H01R 13/6473 |
| | | | | 439/108 |
| 8,173,056 B2* | 5/2012 | Cook | ............... | B29C 39/10 |
| | | | | 264/272.14 |
| 8,801,467 B2* | 8/2014 | Lan | ............... | H01R 12/724 |
| | | | | 439/607.36 |
| 8,944,829 B2* | 2/2015 | Ho | ............... | H01R 13/04 |
| | | | | 439/79 |
| 2003/0198439 A1* | 10/2003 | Hiramatsu | ............... | G02B 6/122 |
| | | | | 385/39 |
| 2003/0228776 A1* | 12/2003 | Egan | ............... | H01R 13/6474 |
| | | | | 439/79 |
| 2004/0094328 A1* | 5/2004 | Fjelstad | ............... | H01R 9/0515 |
| | | | | 174/251 |
| 2006/0084286 A1* | 4/2006 | Kooiman | ............... | H01R 24/52 |
| | | | | 439/63 |
| 2009/0093138 A1* | 4/2009 | Benham | ............... | H01R 23/688 |
| | | | | 439/63 |
| 2010/0022103 A1* | 1/2010 | Murata | ............... | H01R 9/035 |
| | | | | 439/55 |
| 2010/0062638 A1* | 3/2010 | Benham | ............... | H01R 23/688 |
| | | | | 439/578 |
| 2011/0151722 A1* | 6/2011 | Kobayashi | ............... | H01R 13/658 |
| | | | | 439/660 |
| 2019/0165075 A1* | 5/2019 | Yuan | ............... | H01L 27/124 |

* cited by examiner

INTERCONNECT DEVICE

BACKGROUND

Statement of the Technical Field

The present disclosure relates generally to electronic systems. More particularly, the present disclosure relates to interconnect devices for electronic systems.

Description of the Related Art

Interconnect devices are well known in the art. Some of these conventional interconnect devices are Commercial Off The Shelf ("COTS") connectors used in Radio Frequency ("RF") applications. These COTS connectors are referred to as RF connectors. Some of the RF connectors are VITA compliant. However, none of these RF connectors meet all of the requirements for certain applications. For example, some of the RF connectors have flexible cable interfaces, have edge launch connectors in multiple planes, have a relatively low density pin count and/or have relatively poor isolation between adjacent pins which is/are not desirable in certain applications.

SUMMARY

The present disclosure concerns implementing systems and methods for making an interconnect device for electronic circuits. The methods comprise: fabricating a housing as a single 3D printed part having a plurality of apertures with bend angles less than ninety degrees; inserting wires into the plurality of apertures of the housing; and establishing electrical connections respectively between (A) the wires and a plurality of first socket adaptors and (B) the wires and a plurality of second socket adaptors.

In some scenarios, the apertures are designed such that the wires inserted therein all have a same length. Phase matching is provided between sets of a first socket adaptor, a second socket adaptor and a wire. The first socket adaptors are of a same type as the second socket adaptors. A center axis of each first socket adaptor is perpendicular to a center axis of each second socket adaptor. The first socket adaptors and/or the second socket adaptors are arranged as a two dimensional grid of socket adaptors in a given area of the housing. A spacing between adjacent ones of the plurality of first socket adaptors and a spacing between adjacent ones of the plurality of second adaptors are selected to provide an optimized isolation between sets of first socket adaptors, second socket adaptors and wires.

In those or other scenarios, each wire comprises at least one end portion with a first diameter greater than a second diameter of center portion thereof. The end portion engages a sidewall of a respective aperture so that the wire maintains a certain position relative to respective first and second socket adaptors throughout use of the interconnect device. The interconnect device may be VITA compliant, and the electronic circuits may comprise radio circuitry.

BRIEF DESCRIPTION OF THE DRAWINGS

The present solution will be described with reference to the following drawing figures, in which like numerals represent like items throughout the figures.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

An ability to 3D print precision metal parts has opened up new opportunities for fabricating electronic components. Accordingly, the present solution generally concerns an interconnect device with at least one 3D printed part formed of a conductive material (e.g., aluminum). The 3D printed part comprises a housing for wires and socket adaptors. The housing has a plurality of elongate through holes formed therein for receiving and housing the wires. Notably, each elongate through hole has a curved portion with an angle less than ninety degrees. Such curved elongate through holes have not been manufactured in the past since conventional manufacturing and machining technologies only allow for cross drilling straight holes so as to form an aperture with a curved portion having an angle equal to ninety degrees.

Figure 12:
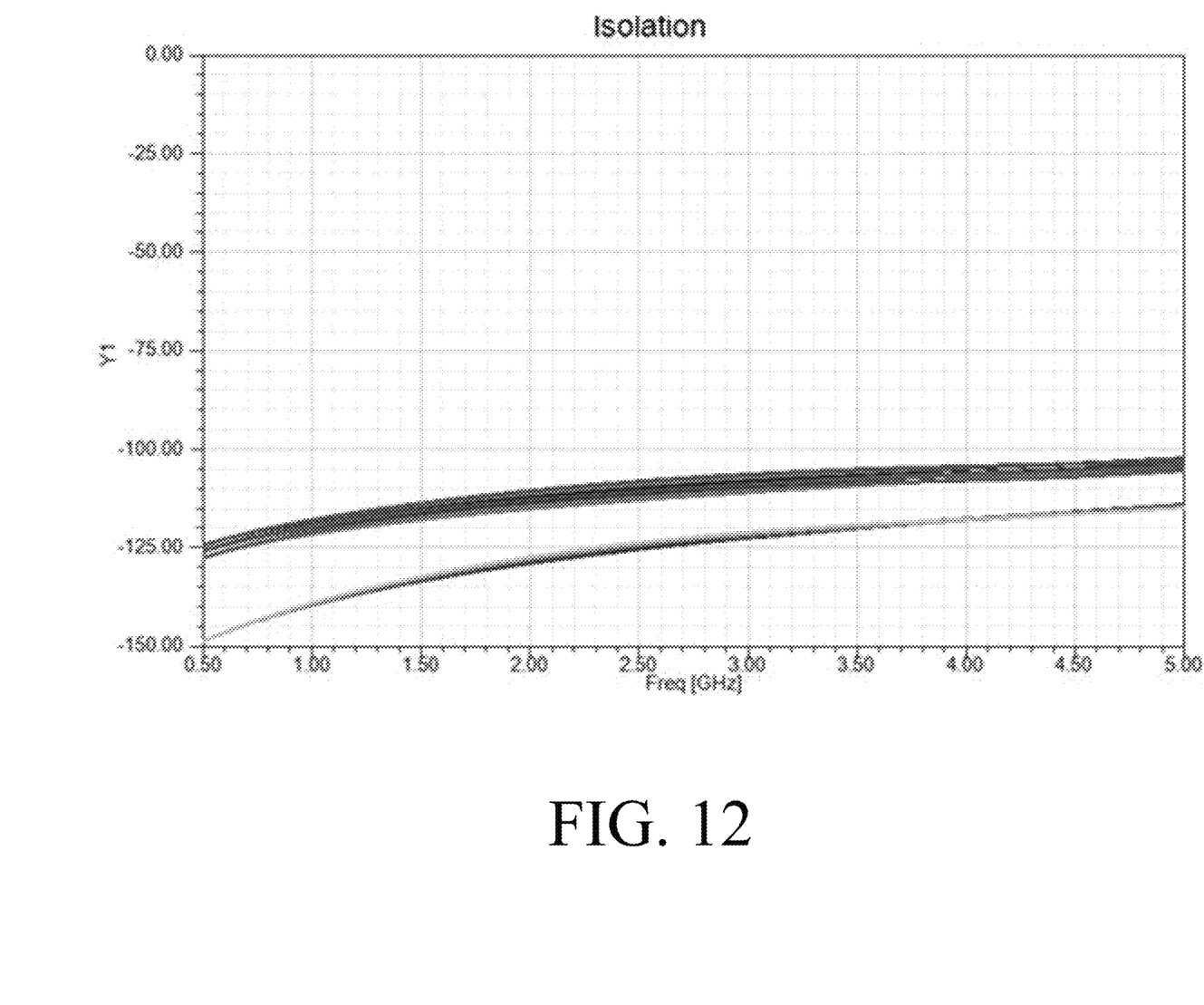
FIG. 12 is a graph showing high isolation between adjacent pins or socket adaptors of an interconnect device.

The interconnect device of the present solution is superior to conventional interconnect devices. In this regard, it should be understood that the present interconnect device has the following features: high density pin or socket adaptor count in a given area; high isolation between adjacent pins or socket adaptors (e.g., as shown in the graph of FIG. 12); a one circuit card application; a simpler design; less costly to incorporate into a product; an x-y grid of connectors or socket adaptors (i.e., connectors or socket adaptors in a single plane which facilitates the one circuit card application) on each of the two interfaces of interconnect device; interface elements (e.g., socket adaptors) that are all the same; no flexible cable connections; VITA compliant (e.g., VITA 67.3 compliant); and/or phase matching between electrical connectors (e.g., sets of two socket adaptors and one wire). Conventional interconnect devices do not each have all of the listed features, and therefore are inferior to the present solution.

Figure 1:
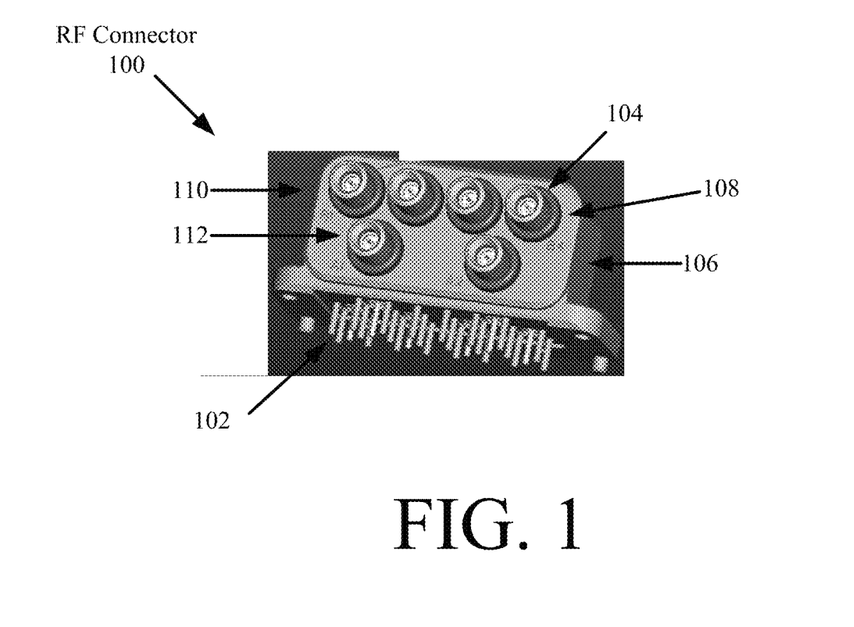
FIG. 1 is a perspective view of a conventional RF connector.
Figure 2:
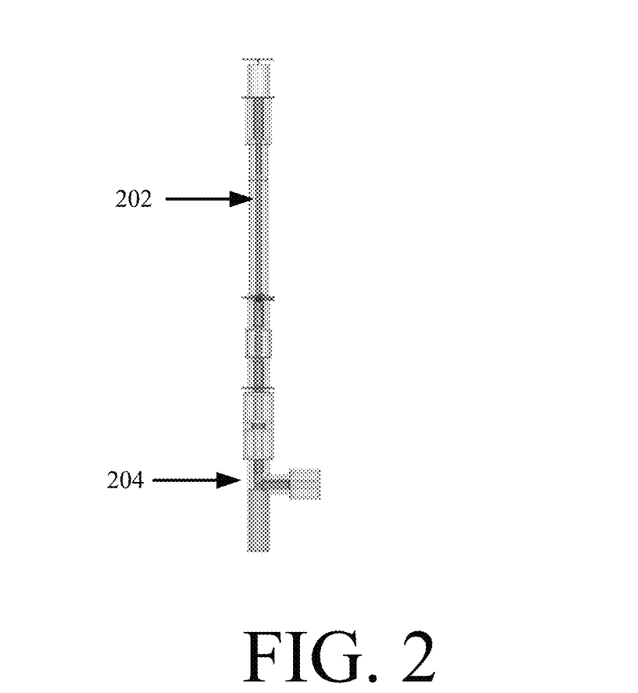
FIG. 2 is an illustration that is useful for understanding the architecture of elongate through holes formed in the RF connector of FIG. 1.

One such conventional interconnect device will now be briefly described in relation to FIGS. 1-2. As shown in FIG. 1, the interconnect device comprises an RF connector 100. The RF connector 100 comprises a first interface formed of a plurality of leads 102 that pass through conductive vias of a Printed Circuit Board ("PCB") (not shown) and a second interface formed of a plurality of socket adaptors 104 for connecting the PCB to another electronic element. The leads 102 and socket adaptors 104 are respectively electrically coupled to each other via wires disposed within a housing 106. The wires pass through elongate apertures 202 formed in the housing 106. Each elongate aperture 202 has a curved portion 204 with a right angle equal to ninety degrees. The elongate aperture 202 is formed by cross drilling two holes in the housing 106.

The conventional RF connector 100 suffers from certain drawbacks. For example, the RF connector 100 is relatively expensive to fabricate, is not VITA compliant, has a relatively low density pin count in area 108 (e.g., <8 socket adaptors in a given interface), and has a relatively low isolation between adjacent pin/socket adaptor connections (e.g., because the wires associated with the socket adaptors of a first row 110 are longer than the wires associated with the socket adaptors of a second row 112, and therefore are not phase matched with each other).

Figure 3:
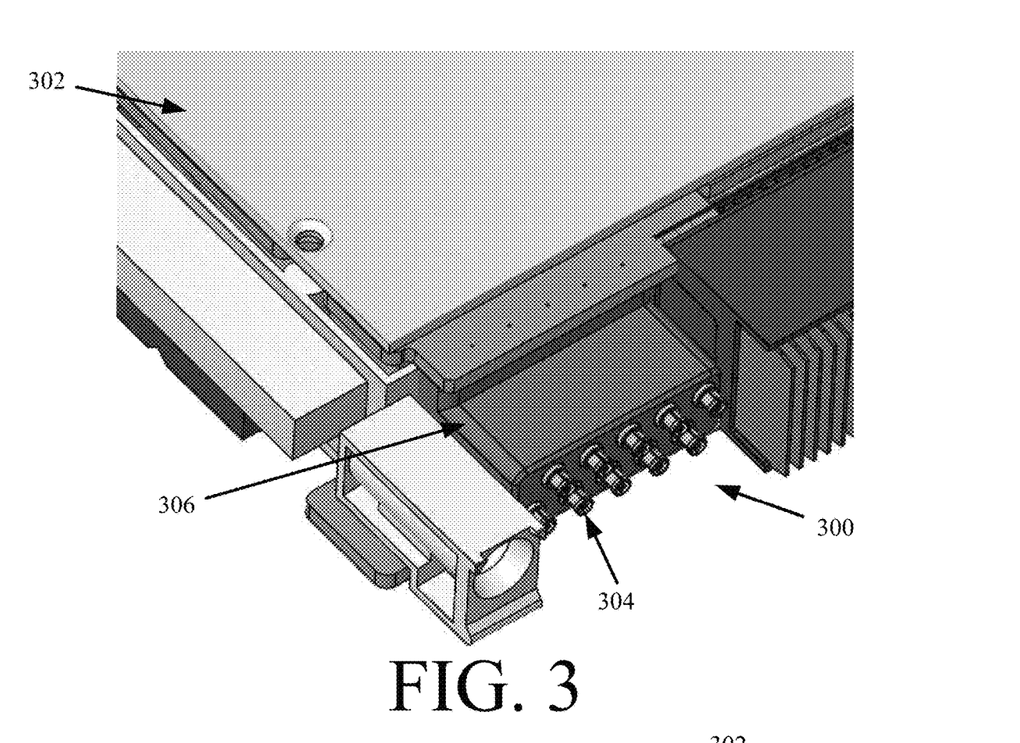
FIG. 3 is a perspective view of an electronic device comprising a circuit board with an interconnect device coupled thereto.
Figure 4:
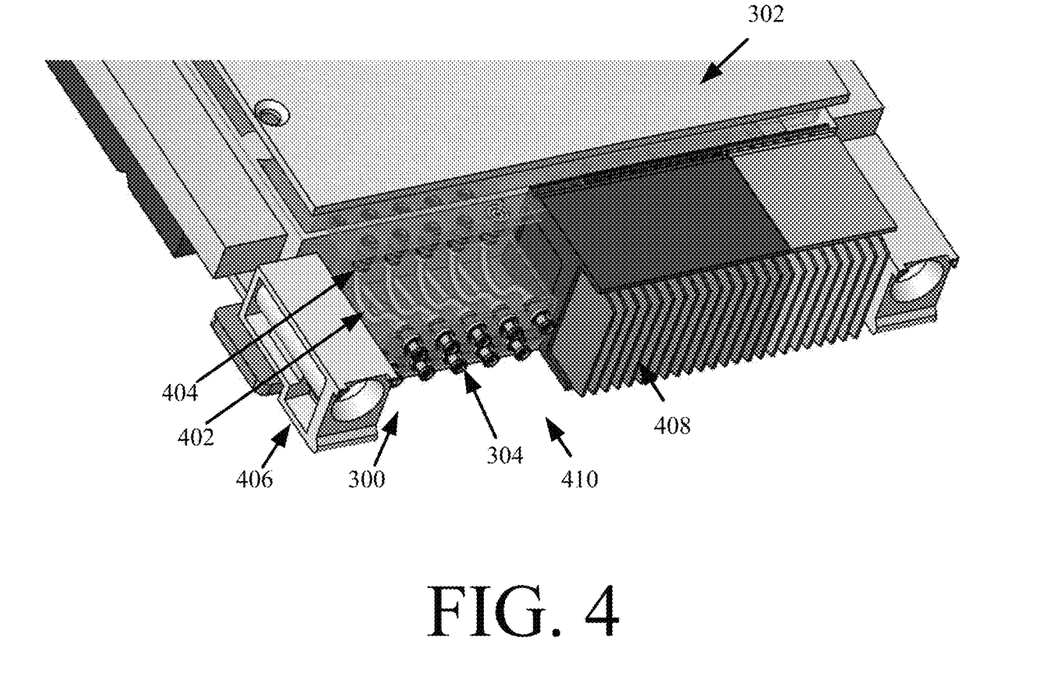
FIG. 4 is a perspective view of the electronic device of FIG. 3 with the interconnect device shown in a transparent form.

Referring now to FIGS. 3-4, there are provided illustrations that are useful for understanding an interconnect device 300 of the present solution. The interconnect device 300 is shown in a solid state in FIG. 3 and a transparent state in FIG. 4. The interconnect device 300 is VITA compliant (e.g., VITA 67.3 compliant).

The interconnect device 300 is shown in FIGS. 3-4 as being coupled to a PCB 302 between other electronic components 406, 408. The interconnect device 300 is sized and shaped to fit within a space 410 existing between electronic components 406, 408. In some scenarios, the space has a length of one inch and a width/depth of three quarters of an inch. The present solution is not limited in this regard.

The PCB 302 includes circuitry. For example, the circuitry includes, but is not limited to, communication components for a radio such as an RF communication device or a Software Defined Radio ("SDR"). Radios, RF communication devices and SDRs are well known in the art, and therefore will not be described herein. The present solution is not limited in this regard. The interconnect device 300 can be used with any embedded computer system or other electronic system.

The interconnect device 300 provides a means to connect the circuitry of the PCB 302 to an external device. In this regard, the interconnect device 300 comprises socket adaptors 304, 404 and wires 402. The wires 402 are disposed in a housing 306 so as to electrically connect first socket adaptors 304 to second socket adaptors 404, respectively. More detailed illustrations of the interconnect device 300 are provided in FIGS. 5-11.

Figure 5:
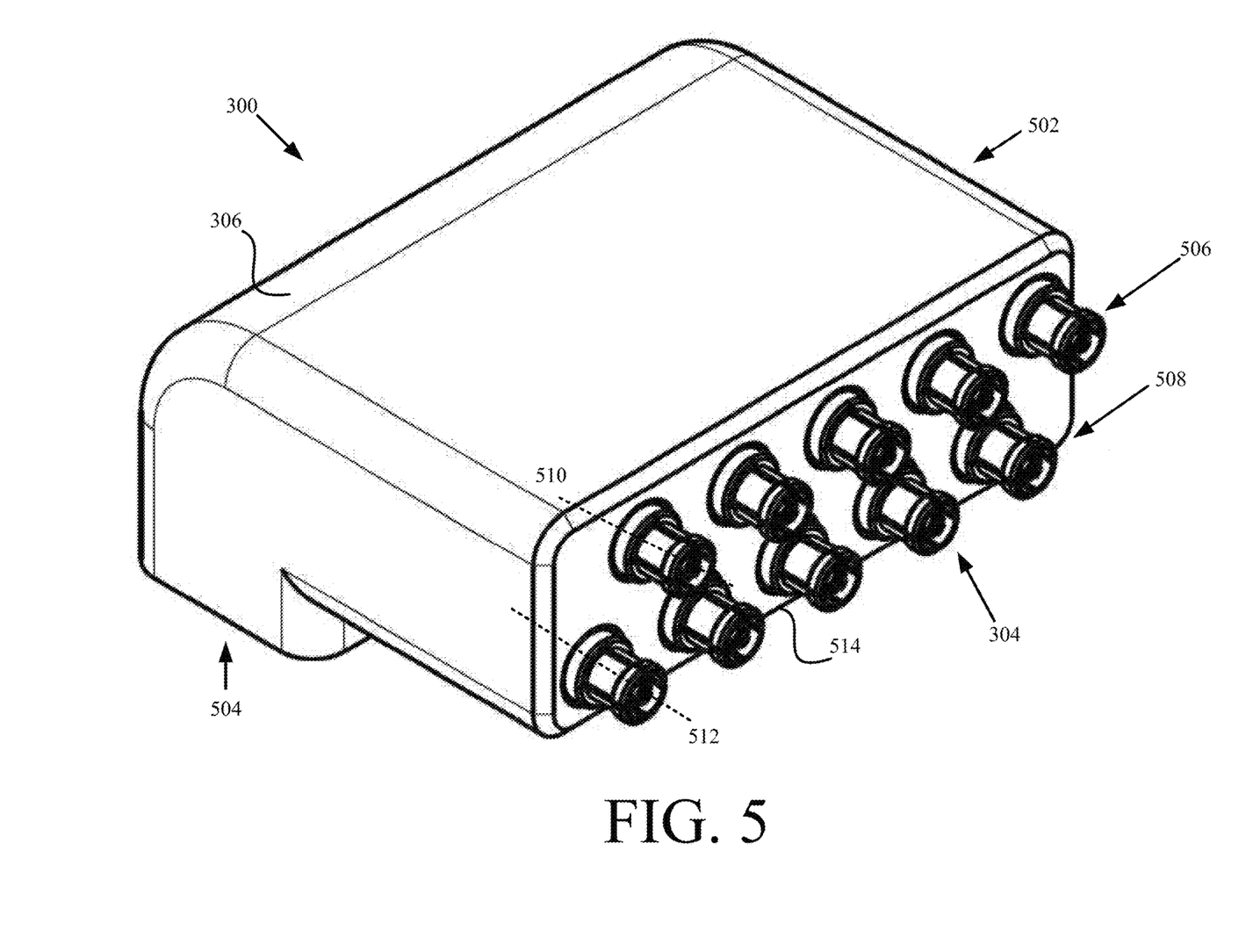
FIG. 5 is a bottom perspective view of the interconnect device shown in FIGS. 3-4.
Figure 6:
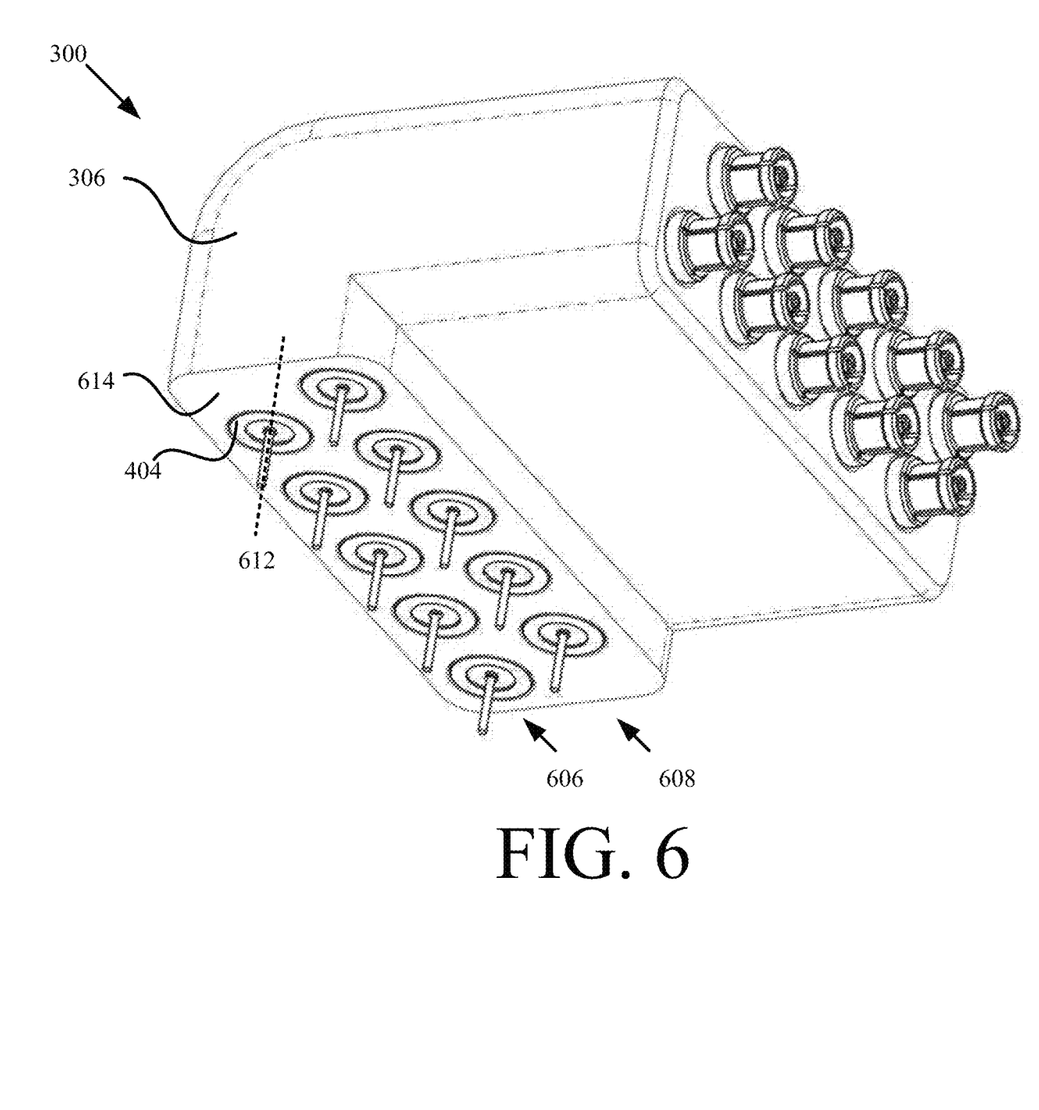
FIG. 6 is a top perspective view of the interconnect device shown in FIG. 5.

Referring now to FIG. 5, there is provided a bottom perspective view of the interconnect device 300. A top perspective view of the interconnect device 300 is provided in FIG. 6. As shown in FIGS. 5-6, the first and second socket adaptors 304, 404 include SMPM bullet adaptors. SMPM bullet adaptors are well known in the art, and therefore will not be described herein. Any known SMPM bullet adaptor can be used here. The present solution is not limited in this regard. Other types of socket adaptors can be used with the present solution in accordance with a given application.

The socket adaptors 304, 404 are at least partially inserted into the housing 306. Ten socket adaptors 304 and ten socket adaptors 404 are shown in FIGS. 5-6. The present solution is not limited in this regard. Any number of socket adaptors can be provided in accordance with a given application. For example, in other scenarios, four or six socket adaptors 306, 404 are provided rather then ten. Still, it should be understood that the present solution allows for a high density of electrical connectors (e.g., 10) in given area (e.g., 1 inch by 1 inch area).

The housing 306 is a 3D printed part formed of a conductive material. The conductive material can include, but is not limited to, aluminum. The housing 306 has a generally L-shape. In this regard, the housing 306 comprises a first portion 502 that extends in a first direction perpendicular to a second direction in which a second portion 504 of the housing extends. First socket adaptors 304 are located in the first portion 502 of the housing 306, while second socket adaptors 404 are located in the second portion 504 of the housing 306.

The first socket adaptors 304 are arranged in a two dimensional grid pattern (e.g., an x-y grid pattern). The two dimensional grid pattern is defined by first and second rows 506, 508 of socket adaptors. The socket adaptors in each row 506, 508 are equally spaced apart from each other in a horizontal direction. However, the socket adaptors of the first row 506 are offset from the socket adaptors in the second row 508. As such, a center axis 506 of a socket adaptor in the first row 506 is offset horizontally from a center axis 512 of a corresponding socket adaptor in the second row 508.

The first socket adaptors 304 are shown as being of the same type. The present solution is not limited in this regard. Two or more of the first socket adaptors can alternatively be of different types selected in accordance with a given application. Still, it should be understood that in some applications it is undesirable to have flexible cable connectors. In this case, the interconnect device 300 is absent of flexible cable connectors (e.g., as shown in FIGS. 3-6).

In some scenarios, the spacing between adjacent socket adaptors is maximized in the given interface area defined by a surface 514 of the housing 306. This spacing maximization facilitates a high isolation between electrical connectors or connections.

Like to the first socket adaptors 304, the second socket adaptors 404 are arranged in a two dimensional grid pattern (e.g., an x-y grid pattern). The two dimensional grid pattern is defined by first and second rows 606, 608 of socket adaptors. The socket adaptors in each row 606, 608 are equally spaced apart from each other in a horizontal direction. However, the socket adaptors of the first row 606 are offset from the socket adaptors in the second row 608. As such, a center axis 606 of a socket adaptor in the first row 606 is offset horizontally from a center axis 612 of a corresponding socket adaptor in the second row 608.

The second socket adaptors 404 are shown as being of the same type. This feature of the present solution ensures that the interconnect device 300 can be used with a single PCB (instead of with two or more PCBs as is required for some conventional RF connectors). The present solution is not limited in this regard. Two or more of the second socket adaptors can alternatively be of different types selected in accordance with a given application.

In some scenarios, the spacing between adjacent socket adaptors is maximized in the given interface area defined by a surface 614 of the housing 306. This spacing maximization facilitates a high isolation between electrical connectors or connections.

Figure 7:
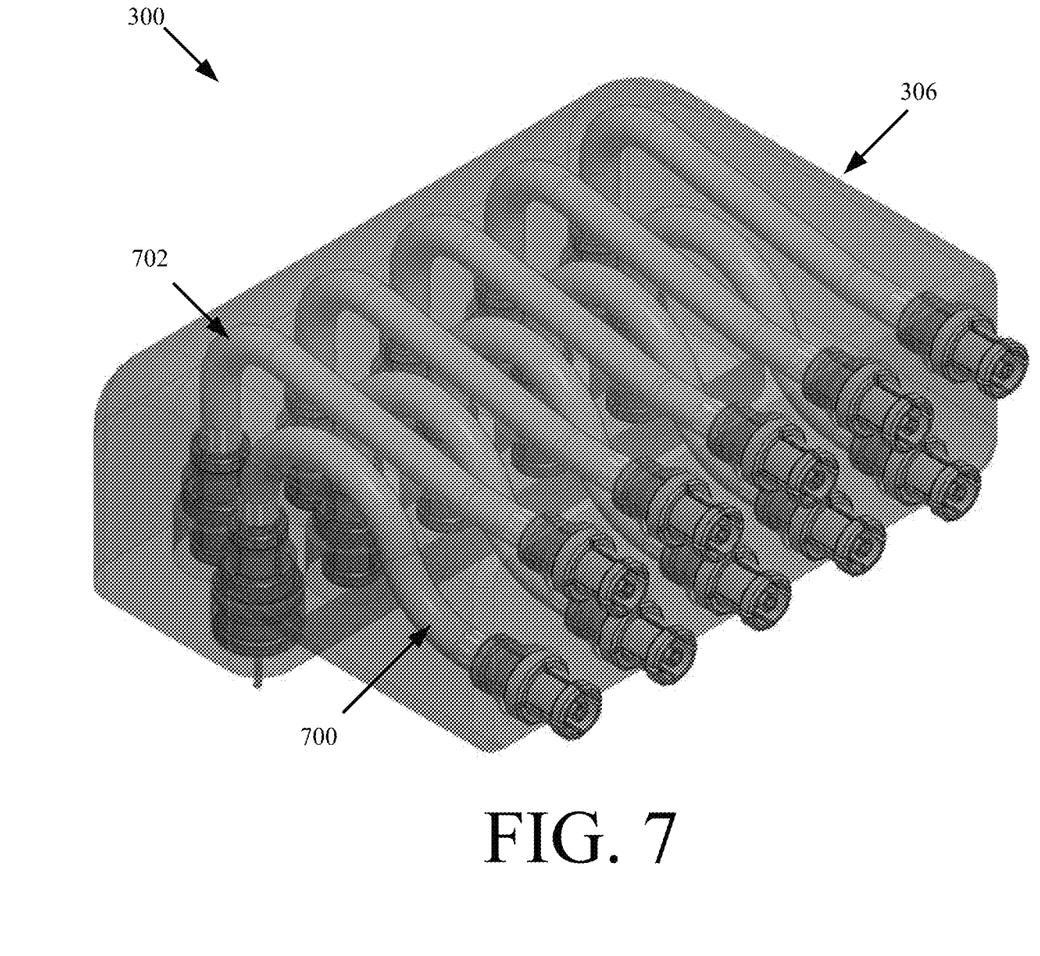
FIG. 7 is a perspective view of the interconnect device shown in FIG. 5 with a housing shown in a transparent form.

Referring now to FIG. 7, there is provided an illustration of the interconnect device 300. Internal elongate apertures 700, 702 are formed in the housing for receiving the wires 402. The housing 306 is shown in a transparent or semi-transparent state so as to allow the internal elongate apertures 700, 702 to be visible. Notably, the apertures 700, 702 are designed such that the wires inserted therein have the same lengths. This design feature facilitates phase matching between sets of two socket adaptors and one wire. The present solution is not limited in this regard. The apertures 700, 702 can alternatively be designed so that the wires inserted therein have different lengths in accordance with a particular application. The apertures 700, 702 will be discussed in more detail below.

Figure 8:
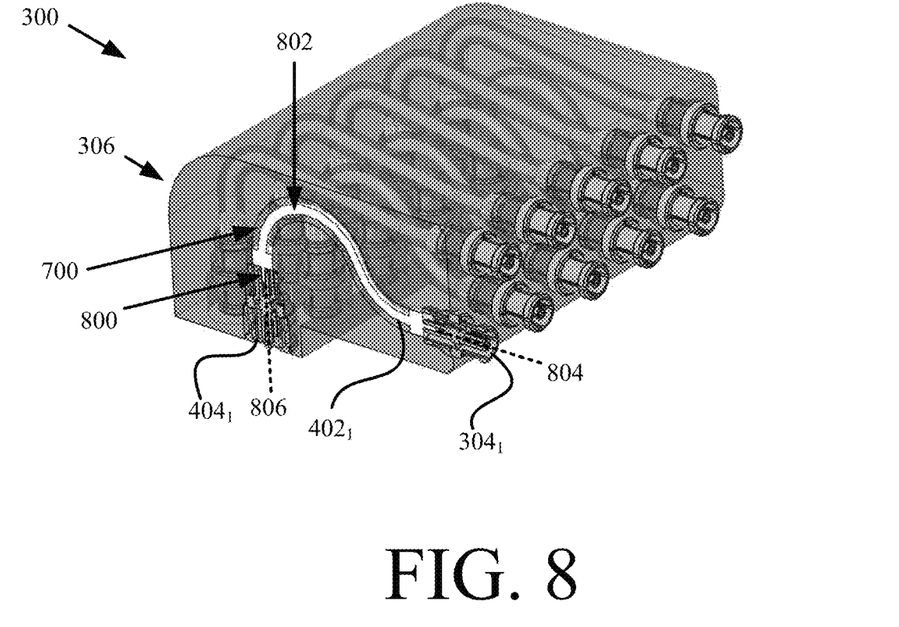
FIG. 8 is a perspective view of the interconnect device shown in FIGS. 3-7 with a first portion cut-away therefrom that is useful for understanding first internal apertures of the housing.
Figure 9:
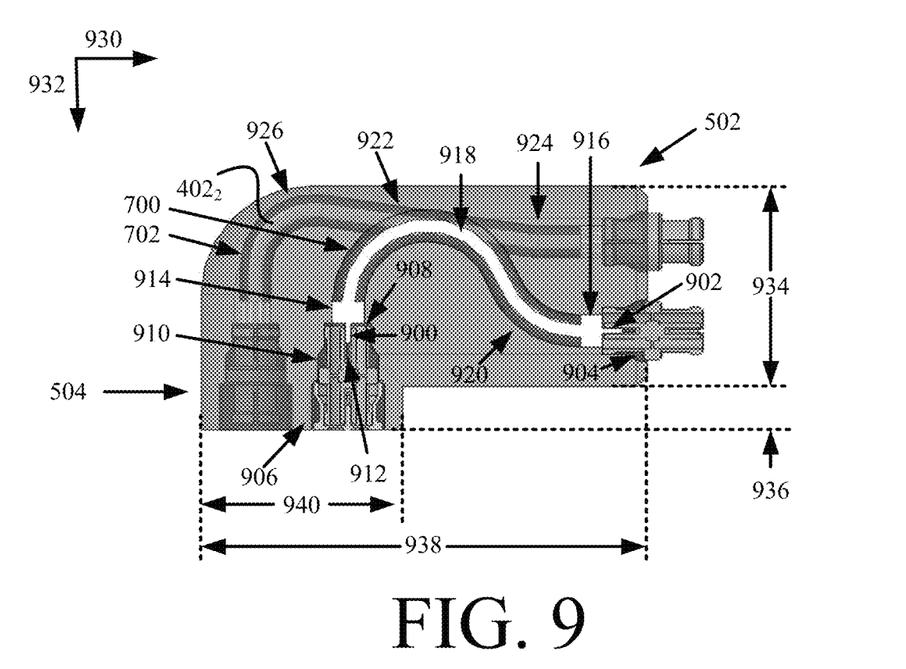
FIG. 9 is a side view of the interconnect device shown in FIGS. 3-7 with the first portion cut-away therefrom.

Referring now to FIGS. 8-9, there are provided illustrations that are useful for understanding the interconnect device 300. In these drawings, the housing 306 is also shown in a semi-transparent state. A portion of the housing 306 has been cut away so that the internal structure and architecture for a set of two socket adaptors $304_1$, $404_1$ and a wire $402_1$ can be seen more clearly.

The socket adaptors $304_1$, $404_1$ are electrically connected to each other via the wire $402_1$. The socket adaptors $304_1$, $404_1$ are arranged such that their center axis 804, 806 are perpendicular to each other. The wire $402_1$ includes a center conductive core 800 covered by an outer dielectric material 802. In some scenarios, wire $402_1$ comprises a micro coaxial cable with an outer jacket and shield removed therefrom. Ends 900, 902 of the conductive core 800 are exposed such that an electrical connection between the conductive core 800 and socket adaptors $304_1$, $404_1$ can be established as shown in FIGS. 8-9.

During fabrication of the interconnect device 300, socket adaptor $404_1$ is inserted into a cavity 906 of the housing 306 until it is engages a wall 908 of the cavity 906. The cavity 906 is sized and shaped so that the socket adaptor $404_1$ is secured and retained therein once fully inserted into the housing 306. The securement and retention is at least partially achieved through a frictional engagement between the adaptor $404_1$ and a sidewall 910 of the cavity 906. The present solution is not limited in this regard. Other securement and retention techniques can be used herein. For example, the securement and retention can be alternatively or additionally facilitated via a press-fit, a snap-fit, and/or an adhesive.

Next, the wire is inserted into a cavity 904 and through the aperture 700 until the end 900 of the center conductive core 800 is fully inserted into an aperture 912 of the socket adaptor $404_1$. Notably, a retention mechanism is provided to facilitate the retention of the wire $402_1$ in the aperture 700.

In some scenarios, the retention mechanism is provided as a part of the wire $402_1$. For example, the outer dielectric material 802 of the wire $402_1$ has at least one end portion 914, 916 with a diameter greater than the diameter of a center portion 918. The diameter(s) of end portion(s) 914, 916 is(are) selected to be the same as or slightly larger than the diameter of the aperture 912 such that a frictional engagement therebetween is established and maintained through use of the interconnect device 300.

In other scenarios, the retention mechanism is provided as a separate component from the wire $402_1$. For example, spacers (not shown) are used to retain the wire $402_1$ in a position relative to the aperture 700. The spacers include a resilient member (e.g., a rubber ring) with a hole formed therein through which the end 900 of the center conductive core 800 and/or end of the outer dielectric material 1104 is inserted. The spacers are designed to have the same or slightly larger diameter (when not in use) than the diameter of the aperture 700 such that a frictional engagement therebetween is established and maintained through use of the interconnect device 300. The spacers can be placed at any location along the elongate length of the aperture 700 and/or wire $402_1$.

Once the wire $404_1$ is fully inserted into the aperture 700, the socket adaptor $304_1$ is then inserted into the cavity 904, whereby an electrical connection is established between the center conductive core 800 and the socket adaptor $304_1$. The socket adaptor $304_1$ is secured and retained in the cavity 904 in the same or similar manner as described above in relation to socket adaptor $404_1$.

Notably, aperture 700 is formed during the 3D printing of the housing 306, rather than being machined or drilled as is done during fabrication of conventional interconnect devices. As such, aperture 700 does not comprise two straight cross-drilled holes having a right angle (i.e., ninety degrees) relative to each other. Instead, aperture 700 has one or more bends 920, 922 with bend angles less than ninety degrees. The bend angles of bends 920, 922 can be the same or different from each other.

This is an important feature of the present solution since it allows for phase matching between connectors (or sets of two socket adaptors and one wire). The phase matching is achieved by providing apertures 700, 702 with the same lengths. In order to provide same length apertures, the bend angles of bends 920, 922 of aperture 700 are greater than the bend angles of bends 924, 926 of aperture 702, respectively. The present solution is not limited in this regard since phase matching may not be desirable in certain applications. In this regard, it should be understood that the apertures 700, 702 can alternatively have different lengths and/or the bend angles of bends 920-926 can be the same or different from each other.

The radius of each bend 920-922 is selected so that the wires $402_1$, $402_2$ can be inserted into the apertures 700, 702. The present solution is not limited in this regard.

As shown in FIG. 9, the first portion 502 of the housing 306 extends in a first direction 930 perpendicular to a second direction 932 in which a second portion 504 of the housing 306 extends. The first portion 502 has a height 934, a width 938 and a length (not shown). The second portion 504 has a height 936, a width 940, and a length (not shown). These dimensions are selected in accordance with a particular application. For example, these dimensions are selected so that the interconnect device 300 fits within the space 410 existing between electronic components 406, 408, as shown in FIGS. 3-4. The present solution is not limited in this regard.

Figure 10:
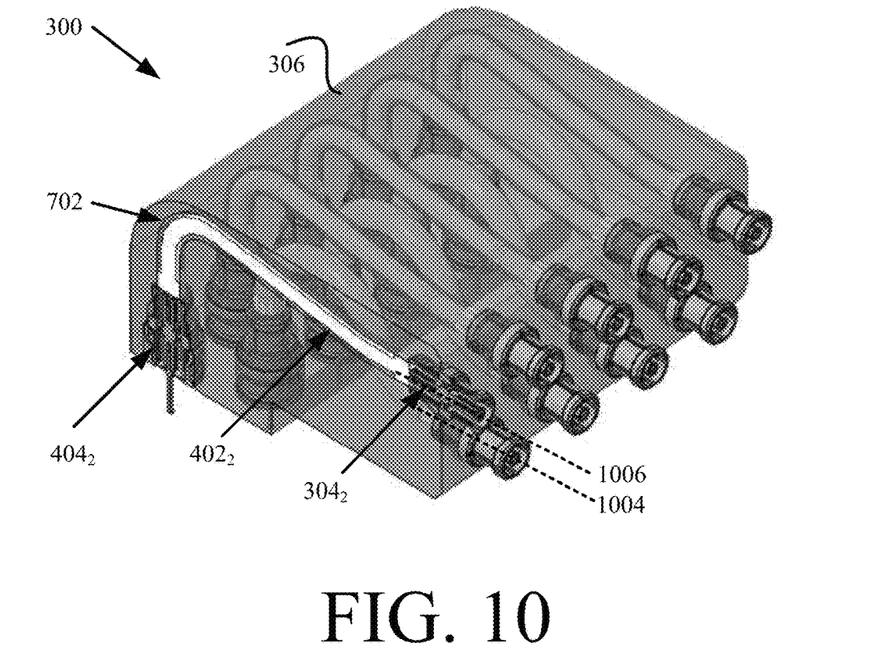
FIG. 10 is a perspective view of the interconnect device shown in FIGS. 3-7 with a second portion cut-away therefrom that is useful for understanding second internal apertures of the housing.
Figure 11:
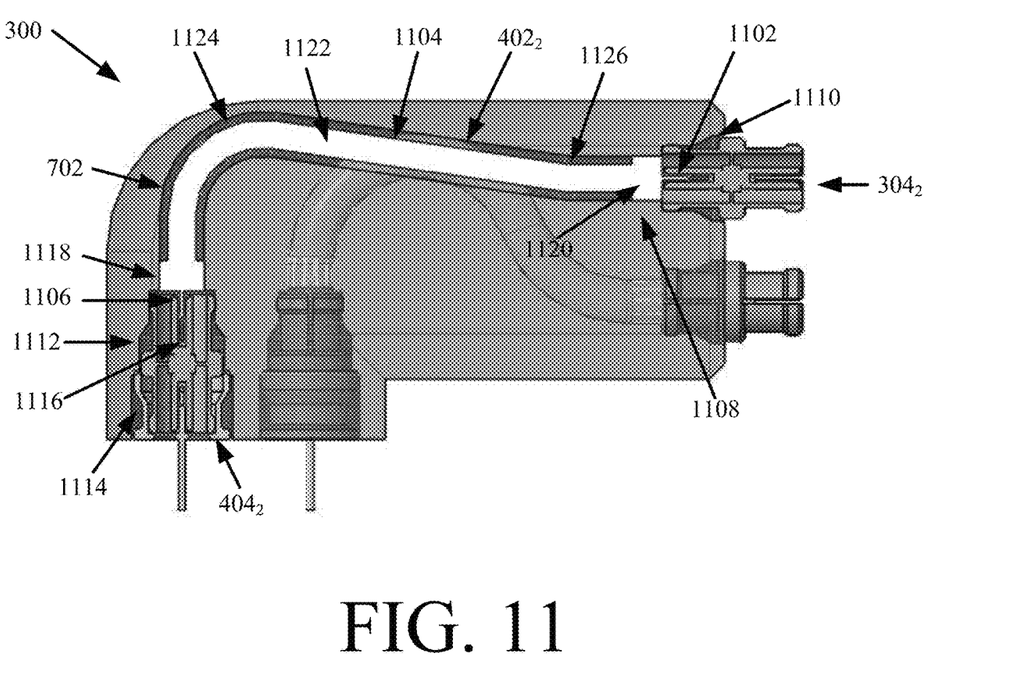
FIG. 11 is a side view of the interconnect device shown in FIGS. 3-10 with the second portion cut-away therefrom.

Referring now to FIGS. 10-11, there are provided illustrations that are useful for understanding the interconnect device 300. In these drawings, the housing 306 is also shown in a semi-transparent state. A portion of the housing 306 has been cut away so that the internal structure and architecture for a set of two socket adaptors $304_2$, $404_2$ and a wire $402_2$ can be seen more clearly.

The socket adaptors $304_2$, $404_2$ are electrically connected to each other via the wire $402_2$. The socket adaptors $304_2$, $404_2$ are arranged such that their center axis 1004, 1006 are perpendicular to each other. The wire $402_2$ includes a center conductive core 1102 covered by an outer dielectric material 1104. In some scenarios, wire $402_2$ comprises a micro coaxial cable with an outer jacket and shield removed therefrom. Ends 1106, 1108 of the conductive core 1102 are exposed such that an electrical connection between the conductive core 1102 and socket adaptors $304_2$, $404_2$ can be established as shown in FIGS. 10-11.

During fabrication of the interconnect device 300, socket adaptor $404_2$ is inserted into a cavity 1114 of the housing 306 until it is engages a wall 1112 of the cavity 1114. The cavity 1114 is sized and shaped so that the socket adaptor $404_2$ is secured and retained therein once fully inserted into the housing 306. The securement and retention is at least partially achieved through a frictional engagement between the adaptor $404_2$ and a sidewall 1112 of the cavity 1114. The present solution is not limited in this regard. Other securement and retention techniques can be used herein. For example, the securement and retention can be alternatively or additionally facilitated via a press-fit, a snap-fit, and/or an adhesive.

Next, the wire $402_2$ is inserted into a cavity 1110 and through the aperture 702 until the end 1108 of the center conductive core 1102 is fully inserted into an aperture 1116 of the socket adaptor $404_2$. Notably, a retention mechanism is provided to facilitate the retention of the wire $402_2$ in the aperture 702.

In some scenarios, the retention mechanism is provided as a part of the wire $402_2$. For example, the outer dielectric material 1104 of the wire $402_2$ can have at least one end portion 1118, 1120 with a diameter greater than the diameter of a center portion 1122. The diameter(s) of end portion(s) 1118, 1120 is(are) selected to be the same as or slightly larger than the diameter of the aperture 702 such that a frictional engagement therebetween is established and maintained through use of the interconnect device 300.

In other scenarios, the retention mechanism is provided as a separate component from the wire $402_2$. For example, spacers (not shown) are used to retain the wire $402_2$ in a position relative to the aperture 702. The spacers include a resilient member (e.g., a rubber ring) with a hole formed therein through which the end of the center conductive core 1102 and/or end of the outer dielectric material 1104 is inserted. The spacers are designed to have the same or slightly larger diameter (when not in use) than the diameter of the aperture 702 such that a frictional engagement therebetween is established and maintained through use of the interconnect device 300. The spacers can be placed at any location along the elongate length of the aperture 702 and/or wire $402_2$.

Once the wire $402_2$ is fully inserted into the aperture 702, the socket adaptor $304_2$ is then inserted into the cavity 1110, whereby an electrical connection is established between the center conductive core 1102 and the socket adaptor $304_2$. The socket adaptor $304_2$ is secured and retained in the cavity 1110 in the same or similar manner as described above in relation to socket adaptor $404_2$.

Notably, aperture 702 is formed during the 3D printing of the housing 306, rather than being machined or drilled as is done during fabrication of conventional interconnect devices. As such, aperture 702 does not comprise two straight cross-drilled holes having a right angle (i.e., ninety degrees) relative to each other. Instead, aperture 702 has one or more bends 1124, 1126 with bend angles less than ninety degrees. The bend angles of bends 1124, 1126 can be the same or different from each other.

Figure 13:
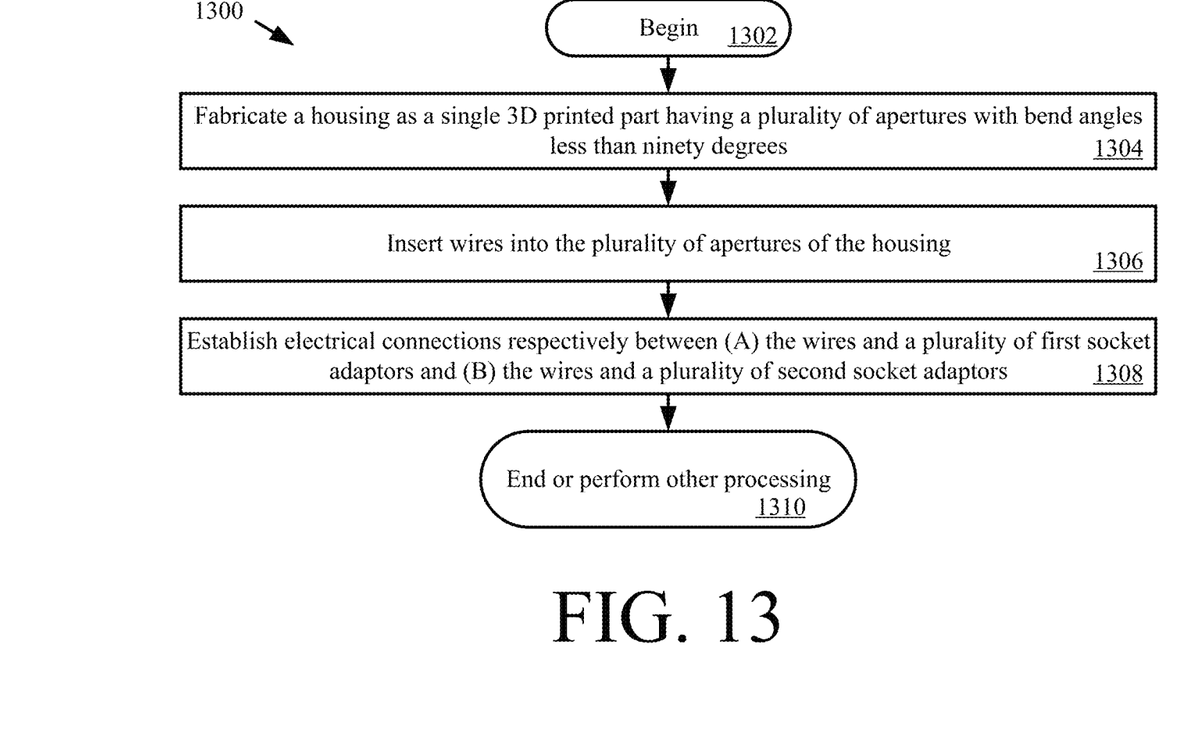
FIG. 13 is a flow diagram of an illustrative method for fabricating an interconnect device.

Referring now to FIG. 13, there is provided a flow diagram of an illustrative method 1300 for making an interconnect device for electronic circuits. The interconnect device is VITA compliant and the electronic circuits comprise radio circuitry. The method 1300 begins with 1302 and continues with 1304 where a housing is fabricated as a single 3D printed part having a plurality of apertures with bend angles less than ninety degrees. Next in 1306, wires are inserted into the plurality of apertures of the housing. In 1308, electrical connections are respectively established between (A) the wires and a plurality of first socket adaptors and (B) the wires and a plurality of second socket adaptors.

In some scenarios, the apertures are designed such that the wires inserted therein all have a same length. Accordingly, phase matching is provided between sets of a first socket adaptor, a second socket adaptor and a wire.

In those or other scenarios, the first socket adaptors are of a same type as the plurality of second socket adaptors. A center axis of each first socket adaptor is perpendicular to a center axis of each second socket adaptor. At least one of the first socket adaptors and the second socket adaptors are arranged as a two dimensional grid of socket adaptors in a given area of the housing. A spacing between adjacent ones of the first socket adaptors and a spacing between adjacent ones of the second adaptors are selected to provide an optimized isolation between sets of first socket adaptors, second socket adaptors and wires.

In those or yet other scenarios, each wire comprises at least one end portion with a first diameter greater than a second diameter of center portion thereof. The end portion engages a sidewall of a respective aperture so that the wire maintains a certain position relative to respective first and second socket adaptors throughout use of the interconnect device.

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. An interconnect device for electronic circuits, comprising:
    a housing comprising a single 3D printed part having a first row comprising a plurality of first apertures with first bend angles less than ninety degrees and a second row comprising a plurality of second apertures with second bend angles less than ninety degrees, wherein the first bend angles are greater than the second bend angles so that lengths of the first apertures in the first row are equal to lengths of the second apertures in the second row;
    a plurality of wires respectively inserted in the plurality of first and second apertures of the housing;
    a plurality of gaps respectively provided between at least lengthwise middle portions of the plurality of wires and sidewalls of the plurality of first and second apertures;
    a plurality of first socket adaptors respectively electrically connected to first ends of the plurality of wires; and
    a plurality of second socket adaptors respectively electrically connected to second ends that are opposed from the first ends of the plurality of wires;
    wherein the plurality of apertures are designed such that the wires inserted therein all have a same length;
    wherein a first aperture of the plurality of first apertures resides adjacent to at least two second apertures of the plurality of second apertures, and the first aperture is both horizontally offset and vertically offset from the two second apertures.

2. The interconnect device according to claim 1, wherein phase matching is provided between sets, each said set comprising one of the plurality of first socket adaptors, one of the plurality of second socket adaptors and one of the plurality of wires.

3. The interconnect device according to claim 1, wherein the plurality of first socket adaptors are of a same type as the plurality of second socket adaptors.

4. The interconnect device according to claim 1, wherein a center axis of each said first socket adaptor is perpendicular to a center axis of each said second socket adaptor.

5. The interconnect device according to claim 1, wherein at least one of the plurality of first socket adaptors and the plurality of second socket adaptors are arranged as a two dimensional grid of socket adaptors in a given area of the housing.

6. The interconnect device according to claim 1, wherein a spacing between adjacent ones of the plurality of first socket adaptors and a spacing between adjacent ones of the plurality of second adaptors are selected to provide an optimized isolation between sets of first socket adaptors, second socket adaptors and wires.

7. The interconnect device according to claim 1, wherein each wire of said wires comprises at least one end portion with a first diameter greater than a second diameter of center portion thereof.

8. The interconnect device according to claim 7, wherein the at least one end portion engages a sidewall of a respective aperture of the plurality of apertures so that the wire maintains a certain position relative to respective first and second socket adaptors throughout use of the interconnect device.

9. The interconnect device according to claim 1, wherein the interconnect device is VITA compliant and the electronic circuits comprise radio circuitry.

10. The interconnect device according to claim 1, wherein at least one aperture of the first or second apertures comprises two bends which have different bend angles.

11. The interconnect device according to claim 1, wherein a portion of the first aperture resides in horizontally aligned with portions of the two second apertures.

* * * * *